(12) United States Patent
Baskaran et al.

(10) Patent No.: US 7,135,404 B2
(45) Date of Patent: Nov. 14, 2006

(54) METHOD FOR APPLYING METAL FEATURES ONTO BARRIER LAYERS USING ELECTROCHEMICAL DEPOSITION

(75) Inventors: Rajesh Baskaran, Kalispell, MT (US); Bioh Kim, Kalispell, MT (US); Linlin Chen, Plano, TX (US); Lyndon W Graham, Hillsboro, OR (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/470,287

(22) PCT Filed: Jan. 10, 2003

(86) PCT No.: PCT/US03/00890

§ 371 (c)(1),
(2), (4) Date: Jul. 22, 2003

(87) PCT Pub. No.: WO03/060959

PCT Pub. Date: Jul. 24, 2003

(65) Prior Publication Data

US 2004/0072419 A1  Apr. 15, 2004

Related U.S. Application Data

(60) Provisional application No. 60/347,520, filed on Jan. 10, 2002.

(51) Int. Cl.
*H01L 21/44* (2006.01)
*C25D 5/34* (2006.01)

(52) U.S. Cl. ................. 438/652; 438/677; 205/219

(58) Field of Classification Search ............... 438/627, 438/653, 677, 687; 205/157, 158, 205, 210, 205/215, 219, 239, 704, 705; 148/516, 518, 148/687, 708
See application file for complete search history.

(56) References Cited

U.S. PATENT DOCUMENTS

| 4,110,176 | A | * | 8/1978 | Creutz et al. ............... 205/296 |
| 4,574,095 | A | * | 3/1986 | Baum et al. ................ 427/584 |
| 4,975,159 | A | * | 12/1990 | Dahms ....................... 205/125 |
| 5,009,714 | A | | 4/1991 | Arrington et al. |
| 5,151,168 | A | | 9/1992 | Gilton et al. |
| 5,164,332 | A | | 11/1992 | Kumar |
| 5,243,222 | A | | 9/1993 | Harper et al. |
| 5,256,274 | A | * | 10/1993 | Poris .......................... 205/123 |
| 5,358,907 | A | * | 10/1994 | Wong ......................... 438/655 |
| 5,891,513 | A | * | 4/1999 | Dubin et al. ................ 438/633 |

(Continued)

FOREIGN PATENT DOCUMENTS

WO    99/53119 A1    10/1999

(Continued)

*Primary Examiner*—Mathew S. Smith
*Assistant Examiner*—Lex H. Malsawma
(74) *Attorney, Agent, or Firm*—Christensen O'Connor Johnson Kindness PLLC

(57) ABSTRACT

The present invention is directed to a process for producing structures containing metallized features for use in microelectric workpieces. The process treats a barrier layer to promote the adhesion between the barrier layer and the metallized feature. Suitable means for promoting adhesion between barrier layers and the metallized features according to the invention include an acid treatment of the barrier layer, an electrolytic treatment of the barrier layer, or deposition of a bonding layer between the barrier layer and metallized feature. The present invention thus modifies an exterior surface of a barrier layer making it more suitable for electrodeposition of metal on a barrier, thus eliminating the need for a PVD or CVD seed layer deposition process.

22 Claims, 10 Drawing Sheets

U.S. PATENT DOCUMENTS

| | | | |
|---|---|---|---|
| 6,197,181 B1 * | 3/2001 | Chen | 205/123 |
| 6,277,263 B1 * | 8/2001 | Chen | 205/182 |
| 6,300,244 B1 | 10/2001 | Itabashi et al. | |
| 6,319,387 B1 | 11/2001 | Krishnamoorthy et al. | |
| 6,413,864 B1 | 7/2002 | Pyo | |
| 6,472,023 B1 * | 10/2002 | Wu et al. | 427/430.1 |
| 6,494,219 B1 * | 12/2002 | Nayak et al. | 134/56 R |
| 6,515,368 B1 * | 2/2003 | Lopatin et al. | 257/762 |
| 6,531,046 B1 * | 3/2003 | Morrissey et al. | 205/219 |
| 2002/0130046 A1 * | 9/2002 | Cheung et al. | 205/104 |

FOREIGN PATENT DOCUMENTS

| | | |
|---|---|---|
| WO | 00/05747 A2 | 2/2000 |

* cited by examiner

METHOD FOR APPLYING METAL FEATURES ONTO BARRIER LAYERS USING ELECTROCHEMICAL DEPOSITION

This claims benefit of 60/347,520, filed Jan. 10, 2002.

FIELD OF THE INVENTION

The present invention is directed to methods for forming metallized structures on barrier layers through electrochemical deposition.

BACKGROUND OF THE INVENTION

In the fabrication of microelectronic devices, application of one or more metallization layers is an important step in the overall fabrication process. The metallization may be used in the formation of discrete microelectronic components, but is most often used to provide interconnect components formed on a workpiece, such as a semiconductor wafer. For example, metallized structures are used to interconnect devices of an integrated circuit.

An integrated circuit is an interconnected ensemble of devices formed within a semiconductor material and within a dielectric material that overlies a surface of the semiconductor. Devices which may be formed within the semiconductor include MOS transistors, bipolar transistors, diodes, and diffused resistors. Devices which may be formed within the dielectric include thin film resistors and capacitors. Typically, more than 100 integrated circuit die (IC chips) are constructed on a single 200 mm diameter silicon wafer. The devices utilized in each die are interconnected by conductor paths formed within the dielectric. Typically, two or more levels of conductor paths, with successive levels separated by a dielectric layer, are employed as interconnections. Aluminum alloy and silicon oxide are examples of materials which have been used for conductive and dielectric features.

With the continuing interest by integrated circuit manufacturers for ways to reduce delays in the propagation of electrical signals, copper has replaced aluminum alloy as the material of choice for interconnect structures.

In addition to its desirable electrical properties, the use of copper as interconnect structures allows integrated circuit manufacturers to leverage electrodeposition process advantages provided by the use of copper. For example, electrodeposition of copper currently provides the most cost-effective manner in which to deposit a copper metallization layer. In addition to being economically viable, electrodeposition techniques provide substantially conformal copper films that are mechanically and electrically suitable for interconnect structures.

Despite the advantages of copper, it has not been as widely used as an interconnect material as one would expect. This is due, at least in part, to the difficulty in effectively and economically depositing copper metallization. For example, depositing copper metallization necessitates the need for the presence of barrier layer materials. The need for barrier layer materials arises from the tendency of copper to diffuse into silicon junctions and alter the electrical characteristics of the semiconductor devices formed in the substrate. Barrier layers made of, for example, titanium, titanium nitride, tantalum, tantalum nitride, tungsten and tungsten nitride, and the like, are typically laid over the silicon junctions and any intervening layers prior to depositing a layer of copper. Unfortunately, materials used as barrier layers typically do not exhibit the electrical conductive properties necessary to allow for the uniform electrochemical deposition of copper directly onto the barrier layers using conventional gap fill chemistries and processes. Accordingly, current practice employs a conductive seed layer applied to the barrier layer before the workpiece is subjected to an electrochemical copper deposition process.

A number of processes for applying a conductive seed layer onto the barrier layer exist. One such process is chemical vapor deposition or CVD, in which a thin copper film is formed on the surface of the barrier layer by thermal decomposition and/or reaction of gas phase copper compositions. CVD can result in conformal copper coverage over a variety of topological profiles; however, CVD is expensive to carry out and utilizes expensive equipment.

Another known technique for depositing a seed layer onto the barrier layer is physical vapor deposition or PVD. PVD provides relatively good adhesion between the barrier layer and the deposit of copper seed layer when compared to a seed layer deposited by CVD. One disadvantage of PVD is that it may result in poor (nonconformal) step coverage when used to fill recessed micro-structures, such as vias and trenches, disposed in the surface of the semiconductor workpiece.

The need to deposit a seed layer using CVD or PVD as described above introduces a process step that requires a large capital investment in equipment to carry out the vapor deposition process. In addition, both PVD and CVD are considered to be relatively slow, thus adversely affecting manufacturing throughput.

Attempts have been made to electrodeposit copper directly onto a barrier layer of titanium nitride or titanium tungsten. However, it has been observed by the present inventors that electrochemical deposition of copper directly onto untreated barrier layers leads to unsatisfactory results, such as poor nucleation and copper peeling due to poor adhesion between the electrodeposited copper and the material of the barrier layer.

In view of the above, the inventors have recognized the need to provide processes for depositing copper onto barrier layers that provide conformal copper coverage with adequate adhesion to the barrier layer, provide adequate deposition rates, are commercially viable, and which do not employ seed layers deposited by PVD or CVD. These needs are met by the processes of the present invention as described below.

BRIEF SUMMARY OF THE INVENTION

The present invention is directed to processes for forming structures containing metallized features for use in microelectronic workpieces, wherein the metallized features are electrochemically deposited onto a barrier layer in the absence of a CVD or PVD deposited seed layer. The processes of the present invention allow integrated circuit manufacturers to reduce their costs and increase their throughput by avoiding expensive and time-consuming CVD or PVD methods for depositing seed layers.

Metallized structures produced by the processes of the present invention include a barrier layer formed adjacent to a substrate and an electrochemically deposited metallized feature adjacent the barrier layer, wherein the barrier layer has been treated in accordance with the present invention. Suitable treatments for the barrier layer according to the invention take a plurality of forms including, treating the surface of the barrier layer with an acid (acid treatment), electrolytically treating the surface of the barrier layer, or electrochemically depositing an alloy on the surface of the barrier layer. Exterior surfaces of the barrier layer treated in accordance with the present invention exhibit an improved ability to adhere to metals electrochemically deposited thereon.

In one aspect of the present invention, a barrier layer is provided on a dielectric feature that is carried by a surface of a microelectronic workpiece. The barrier layer separates the underlying dielectric feature from metallized features that are to be formed on the barrier layer. In accordance with the present invention, the barrier layer is modified by electrolytically treating it before electrochemically depositing a metallized feature, such as seed layer or gap-fill metallization. By modifying the surface of the barrier layer, adhesion between the barrier layer and the electrochemically deposited metallized feature is improved and peeling of the deposited metallized feature from the barrier layer due to subsequent processing steps such as rinsing and drying is reduced or avoided.

In another aspect of the present invention, the barrier layer overlying a dielectric feature is modified by treating the surface of the barrier layer with an acid. The surface of the barrier layer after the acid treatment exhibits improved adhesion to a metallized feature subsequently deposited onto the surface of the barrier layer. The improved adhesion helps the subsequently deposited formed structure avoid delamination when it is subjected to subsequent processing steps such as rinsing and drying.

In another aspect, a barrier layer is modified by depositing an alloy of constant or varying composition onto the barrier layer using an electrochemical process. The alloy includes a first and a second metal where at least one of the metals forming the alloy is the same as the metal that comprises the metallized feature that is to be deposited on the alloy over the barrier layer.

The methods of the present invention can be used, in one instance, in microelectronic processing at any stage of processing where a barrier feature has been deposited and a metallized feature is desired to be formed thereon. The processes are useful in damascene and non-damascene architectures. Non-damascene architectures include those wherein the metallized features are provided through an additive process wherein the metal features are built up on a flat surface using photoresist and photolithography techniques. Such processes include those that pattern a photoresist over a blanket barrier layer. A seed layer is then deposited onto the portions of the barrier layer exposed between the patterned photoresist features. Gap fill copper is then deposited onto the seed layer between the patterned photoresist features. The photoresist is then stripped, followed by stripping of the barrier layer. A dielectric material is then added to electrically isolate the formed metallized features.

The processes of the present invention provide an attractive alternative to processes that deposit seed layers using PVD or CVD. By avoiding the costs associated with PVD and CVD, integrated circuit manufacturers will be able to produce their products more cost-effectively. The present invention will also allow integrated circuit manufacturers to increase their throughput by avoiding time-consuming PVD or CVD used to deposit seed layers. By improving the adhesion between barrier layers and metallized features formed over the barrier layers, delamination between the metallized features and the barrier layer as a result of subsequent processing steps is reduced. Integrated circuit manufacturers will find this desirable as it will increase production yields and produce more reliable devices.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

A basic understanding of certain terms used herein will assist the reader in understanding the disclosed subject matter. To this end, definitions of certain terms, as used herein, are set forth below.

As used herein, the term "microelectronic workpiece" or "workpiece" is not limited to semiconductor wafers, but rather refers to workpieces having generally parallel planar first and second surfaces and that are relatively thin, including semiconductor wafers, ceramic workpieces, and other workpieces upon which microelectronic circuits or components comprising submicron features, data storage elements or layers, and/or micromechanical elements are formed.

As used herein, the term "substrate" refers to a base layer of material over which one or more metallization levels are disposed. The substrate may be, for example, a semiconductor, a ceramic, a dielectric, etc.

As used herein, "barrier layer" is used to denote any feature that acts to prevent the migration of metals or any other material to or from a conducting region to or from a non-conducting region of the microelectronic workpiece.

The present invention is directed to processes for forming metallized structures for microelectronic workpieces that include a barrier layer formed on an underlying substrate, such as on a semiconductor material or a dielectric material. The metallized structures thus have applicability to diverse classes of microelectronic components and/or interconnects. In accordance with processes of the present invention, metallized features are formed by a process that includes a step of modifying a barrier layer so as to improve the adhesion between the barrier layer and a metallized feature electrochemically deposited on the barrier layer. A structure formed in accordance with the present invention is described below, followed by a description of several embodiments of processes carried out in accordance with the present invention. The following description refers to the electrolytic deposition of copper; however, the present invention is not necessarily limited to the electrolytic deposition of copper. Other electrochemical deposition processes and other metals may be useful.

Figure 1:
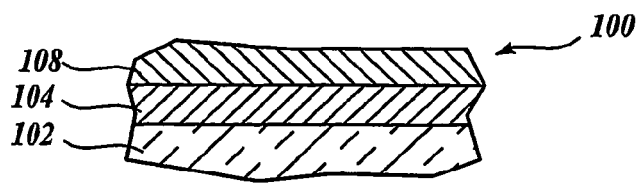
FIG. 1 shows a schematic illustration of a structure formed according to the present invention.
Figure 3:
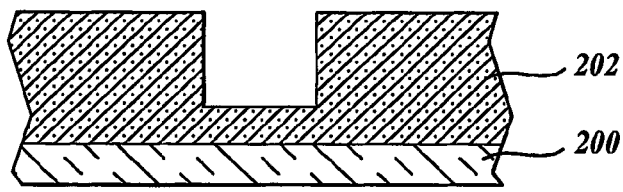
FIGS. 3–6 show a schematic illustration of a sequence of processing steps that includes a treatment of a barrier layer in accordance with the present invention.
Figure 4:
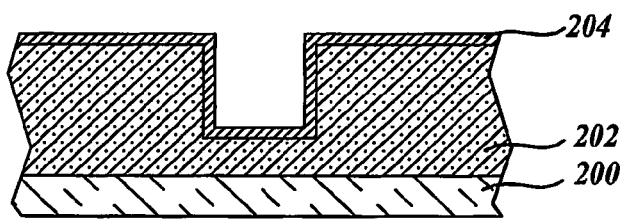
Figure 5:
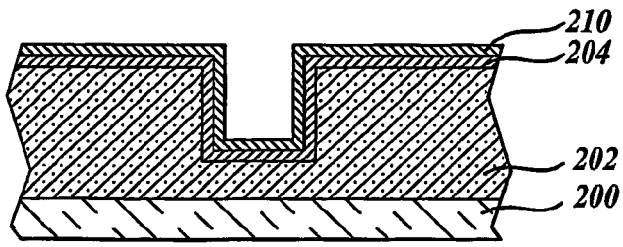
Figure 6:
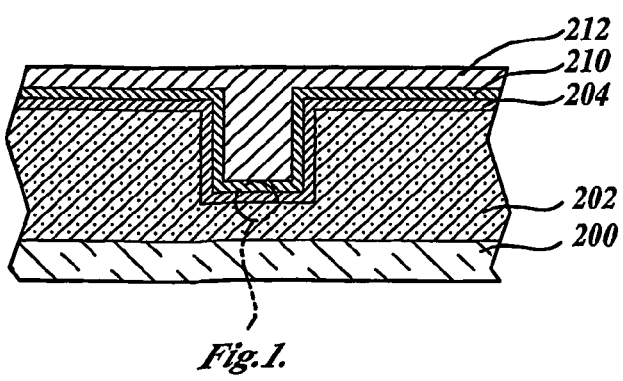
Figure 2:
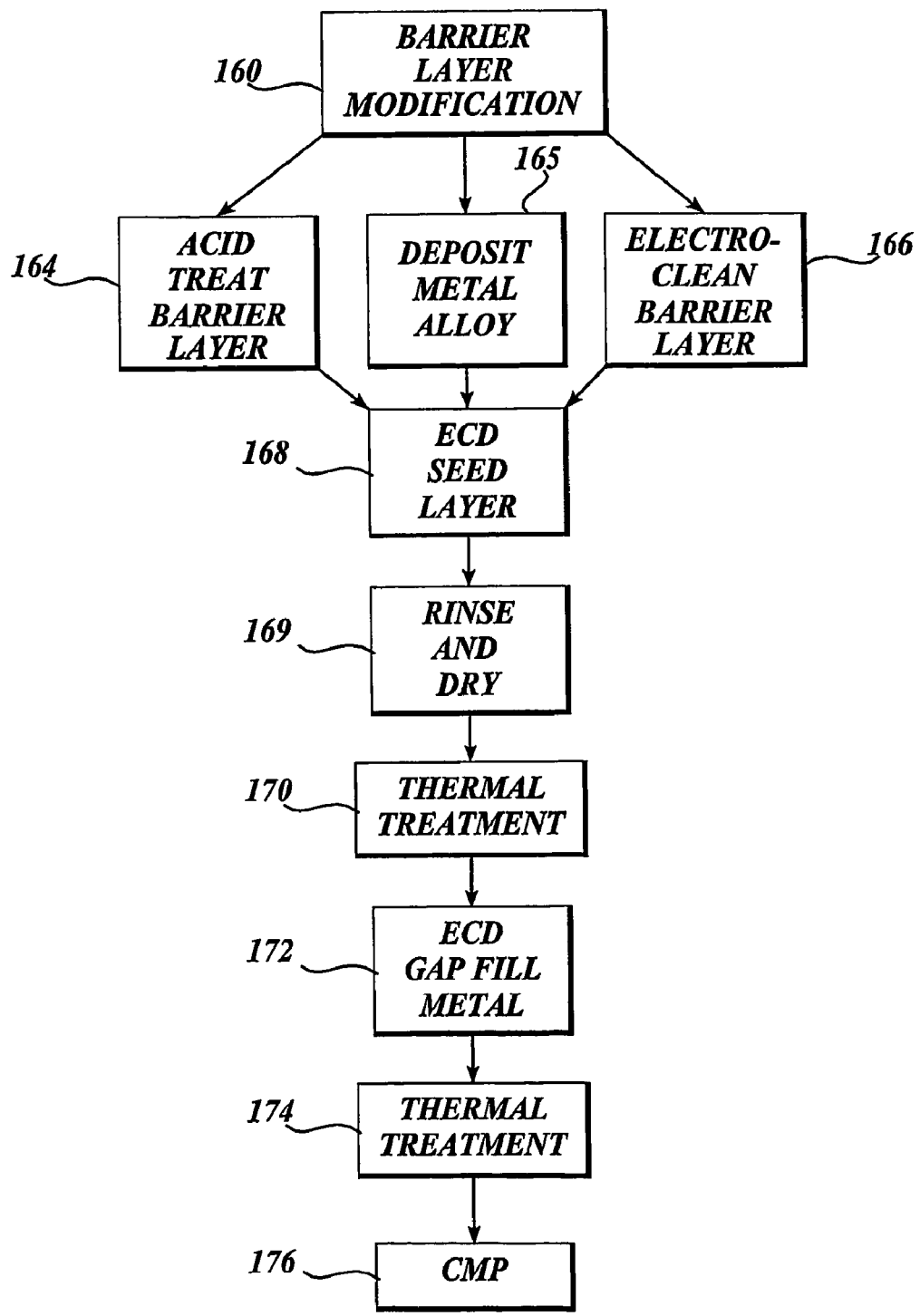
FIG. 2 shows a schematic flow sheet of a process according to the present invention for forming a metallized feature on a barrier layer.

FIG. 1 illustrates a metallized structure 100 formed in accordance with the present invention. Structure 100 is useful in the manufacture of microelectronic workpieces containing a plurality of devices, wherein such devices are capable of utilizing structure 100 for interconnects between the devices. Structure 100 can form the bottom of an interconnect and/or the sides of metallized features, such as would be the case in recessed features. Typical interconnect features are submicron in size, for example 30 to 500 nanometers. Structure 100 includes a substrate 102 and a barrier layer 104 disposed exterior to substrate 102. Disposed exterior to barrier layer 104 is metallized feature 108.

As described above, substrate 102 is typically a dielectric, the composition of which is generally dependent on the function of the metallized structure 100. When the metallized structure 100 is used to implement a post or line of an electrical interconnect network, dielectric layer 102 is preferably comprised of a low-k material. When the metallized structure is used to implement a discrete microelectronic component such as a capacitor, however, the dielectric layer 102 is preferably comprised of a high-k material.

Barrier layer 104 is useful to prevent diffusion or migration of atoms from metallized feature 108 into dielectric 102. Suitable materials for forming barrier layer 104 include, but are not limited to titanium, titanium nitride, titanium silicon nitride (TiSiN), tantalum, tantalum nitride, or tantalum silicon nitride (TaSiN). Barrier layer 104 can be deposited by any of the various known techniques, such as CVD, PVD, or atomic layer chemical vapor deposition. The particular process chosen to deposit the barrier layer will depend upon the particular material being used to form the barrier layer. Exemplary thicknesses for a barrier layer are 10–100 nanometers.

Figure 16:
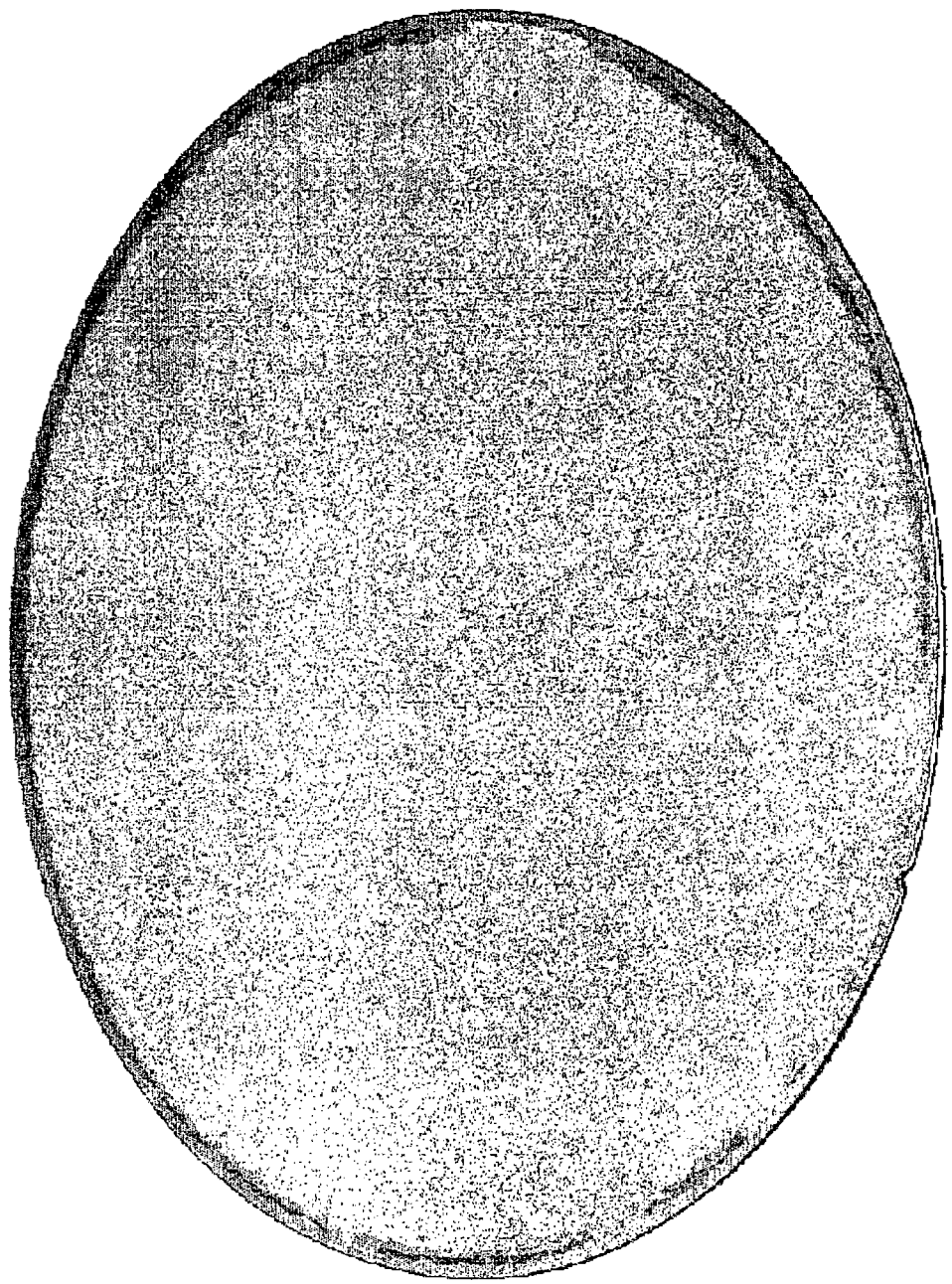
FIG. 16 is a photo of an electrolytically deposited copper layer delaminating from a barrier layer that has not been treated in accordance with the present invention.
Figure 17:
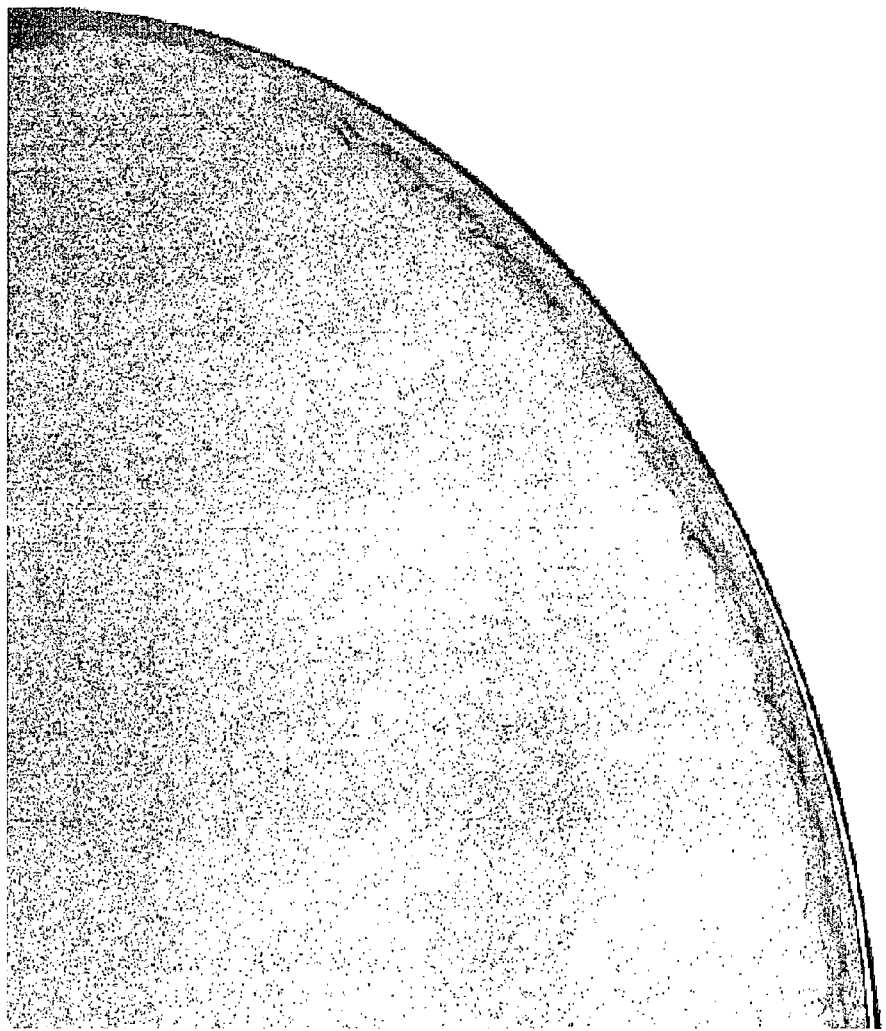
FIG. 17 is a close-up view of a portion of the edge of the wafer of FIG. 16.
Figure 18:
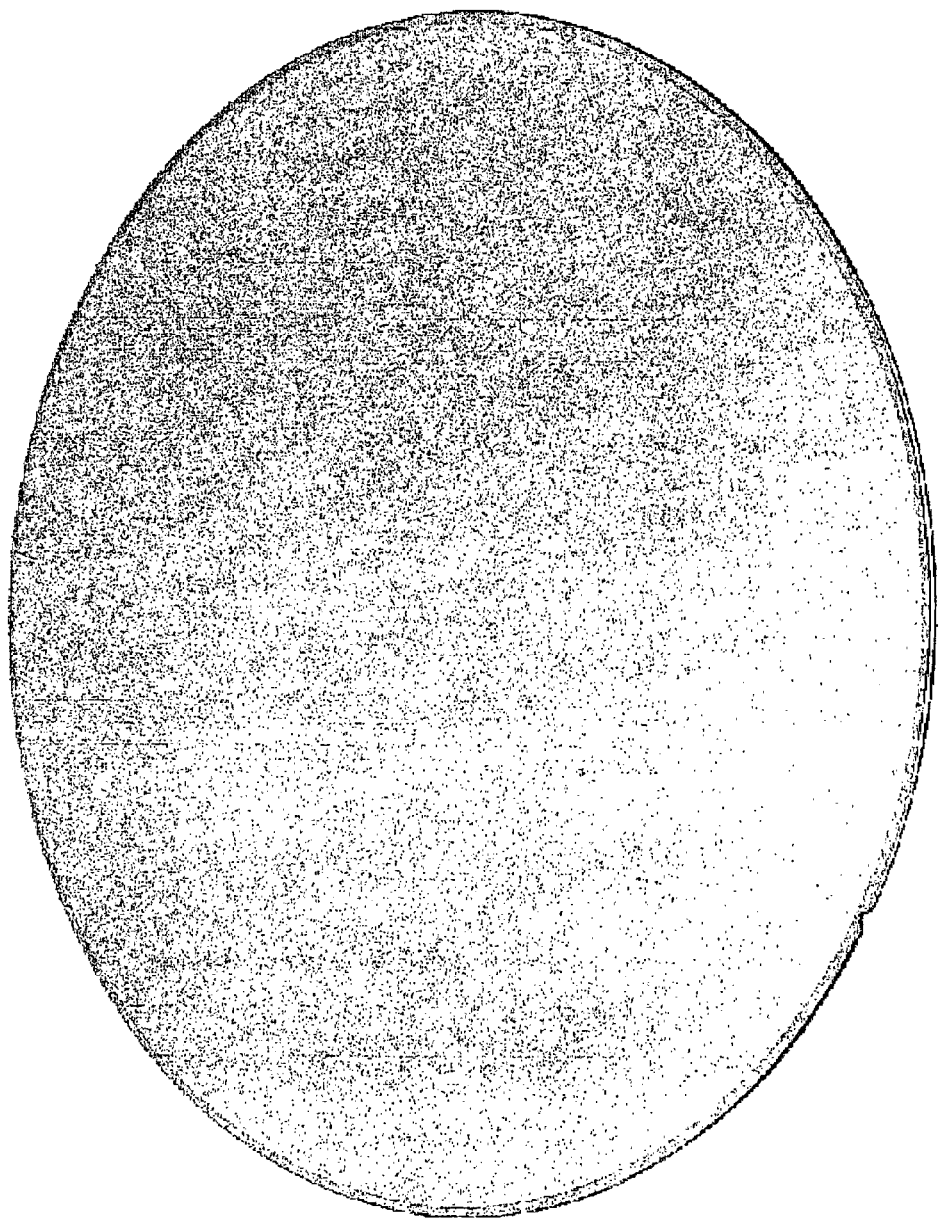
FIG. 18 is a photo of a copper layer electrolytically deposited onto a barrier layer acid treated in accordance with the present invention.
Figure 19:
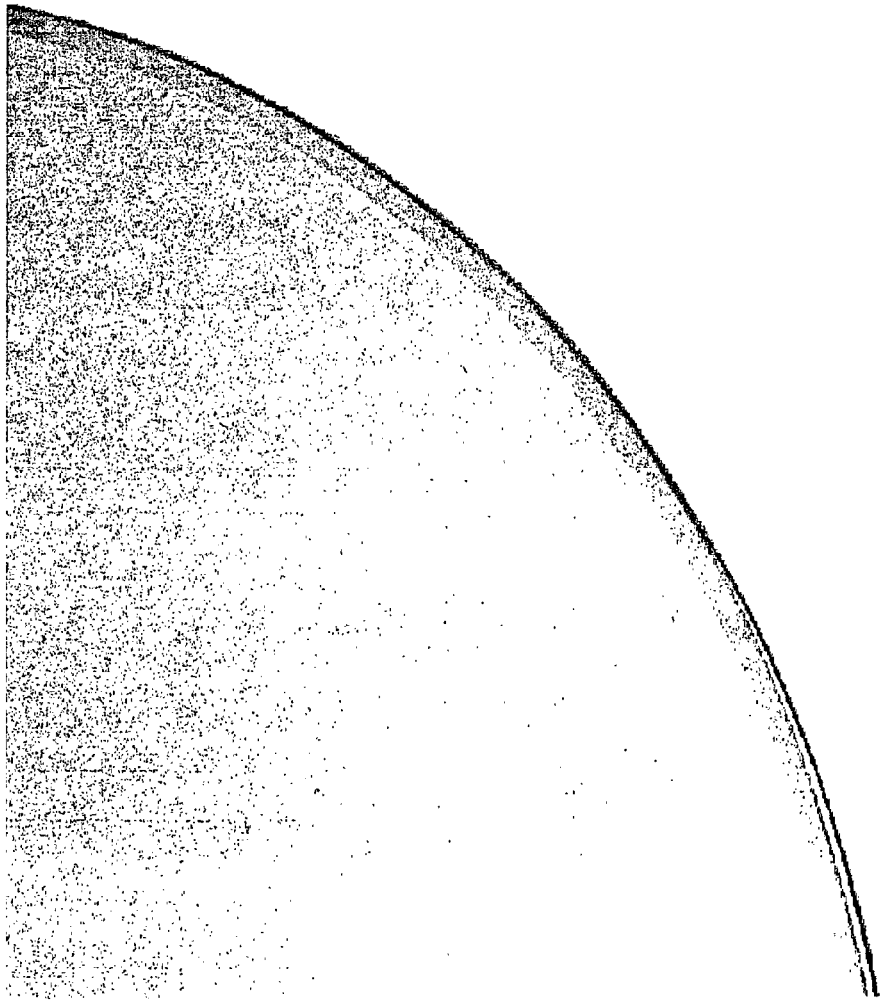
FIG. 19 is a close-up view of a portion of the edge of the wafer of FIG. 18.

As discussed in the background, the present inventors have observed that attempting to electrolytically deposit copper directly onto an untreated barrier layer results in less than satisfactory results, particularly from the standpoint of the adhesion between barrier layer 104 and metallized structure 108. FIGS. 16 and 17 are photographs of a wafer with copper plated directly onto an untreated tantalum barrier layer, followed by rinsing and drying. In contrast, FIGS. 18 and 19 are photographs of a wafer with copper electrolytically deposited directly onto a tantalum barrier layer subjected to an acid treatment in accordance with the present invention followed by rinse and dry steps. The wafer in FIGS. 18 and 19 shows copper present on the whole surface of the wafer without any peeling or debonding evident. In contrast, the wafer shown in FIGS. 16 and 17 exhibits copper peeling and bonding near the edges of the wafer.

Figure 20:
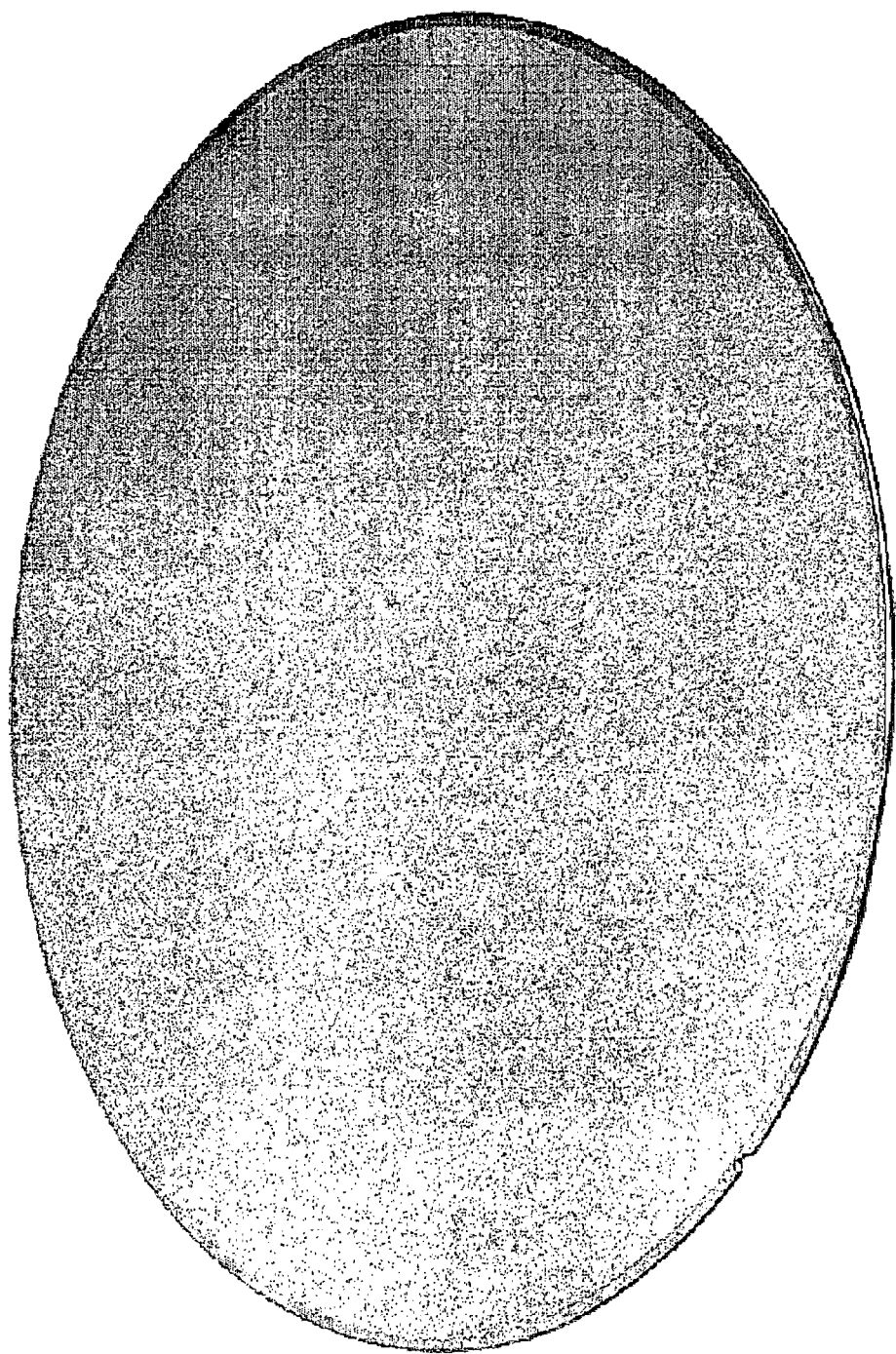
FIG. 20 is a photo of a copper layer electrolytically deposited onto a barrier layer electrolytically treated in accordance with the present invention.
Figure 21:
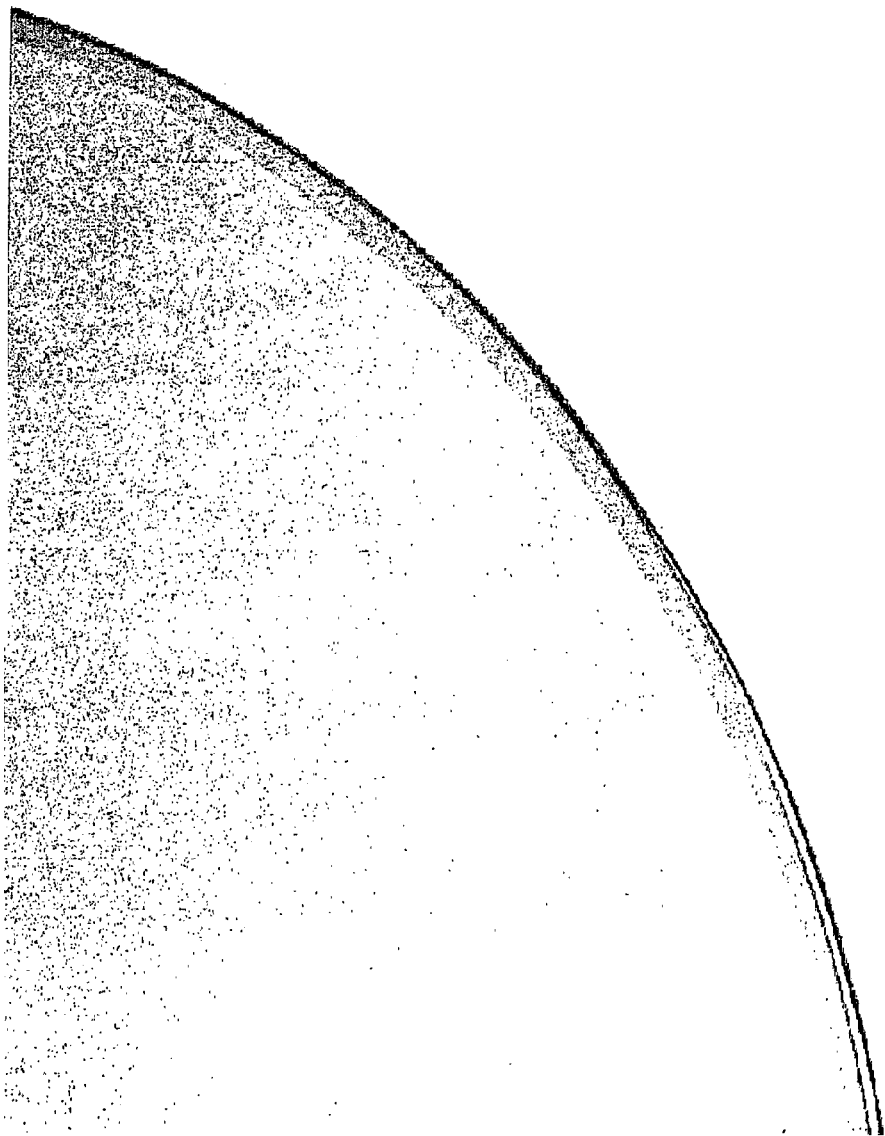
FIG. 21 is a close-up view of a portion of the edge of the wafer of FIG. 20.

FIGS. 20 and 21 are photographs of a wafer with copper electrolytically deposited directly onto a tantalum barrier layer subjected to a cathodic electrolytic treatment as described below in more detail. After rinsing and drying, there is no evidence of peeling or debonding of the copper layer on the wafer of FIGS. 20–21.

The deposited copper in FIGS. 18–21 appears smooth and dense compared to the copper layer of FIGS. 16–17. A comparison of these figures provides a qualitative measure of the impact of acid treating and electrolytically treating a barrier layer prior to direct electrolytic deposition of copper onto the barrier layer.

Referring to FIGS. 2–6, a processing sequence for forming metallized features incorporating processes according to the present invention is illustrated. It should be readily apparent that a dielectric structure 202 and a barrier layer 204 have been provided on a substrate 200 prior to the barrier layer modification step identified in block 160 of FIG. 2. As mentioned above, barrier layer 204 is subjected to an acid treatment step 164, or an electrolytic treatment step 166. Once barrier layer 204 has been subjected to the acid treatment or the electrolytic treatment, metallized feature 210 can be deposited electrochemically, preferably electrolytically onto the barrier layer at 168. Examples of metallized feature 210 include a seed layer or gap fill metallization. A non-limiting example of a suitable material for the metallized feature is copper. While copper is a suitable low resistivity material, other suitable materials, such as noble metals or their alloys can be used to form the metallized features on a microelectronic workpiece. Without limitation, other useful metals include silver, tin, lead, cadmium, platinum, palladium, iridium, ruthenium, chromium, cobalt, zinc, gold, and alloys thereof and any combination thereof.

Continuing to refer to FIGS. 2–6, in an embodiment where the metallized feature 210 is a seed layer, following the deposition of the seed layer, the surface of the microelectronic workpiece carrying the dielectric, barrier layer and metallized feature is rinsed and dried at block 169. A benefit of the present invention is that the adhesion between the treated barrier layer and the metallized feature is such that the rigors of the rinsing and drying step described below do not result in peeling or delamination of the metallized feature from the treated barrier layer.

In most embodiments, after the rinsing and drying, a thermal processing step 170 is used to further improve the adhesion between the deposited metallized feature 210 and treated barrier layer 204. This thermal treatment step 170 cannot be carried out before the rinsing and drying step 169 because the surface of the deposited seed layer contains remnants of the plating bath on its surface. These drops of solution adhering to the freshly electrodeposited seed layer need to be removed by rinsing with deionized water and then drying the wafer to remove water droplets. The rinse and dry steps are important; without these two steps, plating solution droplets left on the wet wafer surface can crystallize and cause particle problems if annealed. Following optional thermal treatment step at 170, in embodiments where the metallized feature is a seed layer, gap-fill metal is deposited at block 172 to complete the metallized structure. The gap-fill electrodeposition is followed by a second thermal treatment step at block 174. Depending on the architecture employed, a chemical mechanical polishing step 176 can take place, if required, to remove unwanted portions of the barrier layer 204, metallized feature 210, and gap fill metallization 212. At future technology nodes where feature sizes will be even smaller, the deposition of metal at block 168 may perform functions of the steps carried out at block 172 (ECD seed layer deposition and ECD gap fill metal deposition occurring simultaneously), while conformally lining larger features. In such a process, portions of the workpiece may have structures completely filled by copper after the steps carried out at block 168, but nevertheless will undergo steps 169 and 170, followed by step 172, to fill larger features to ensure complete copper gap filling. In situations where block 168 performs the functions of block 172 completely for the entire range of feature sizes, steps 170 and 172 may be eliminated. The aforementioned sequence of processing steps may be repeated to form further levels containing any number of metallized features.

Referring to FIGS. 7–15, a further non-limiting example of a workpiece formation process wherein processes of the present invention may be utilized is schematically depicted.

Figure 7:
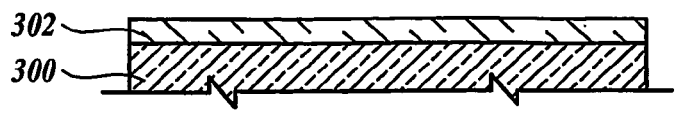
FIGS. 7–15 show a schematic illustration of a second sequence of processing steps that includes a treatment of a barrier layer in accordance with the present invention.
Figure 8:
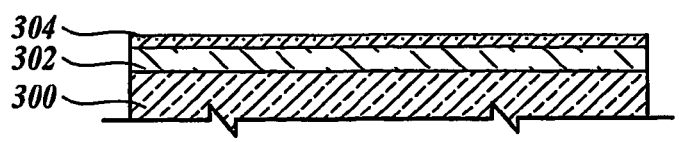
Figure 9:
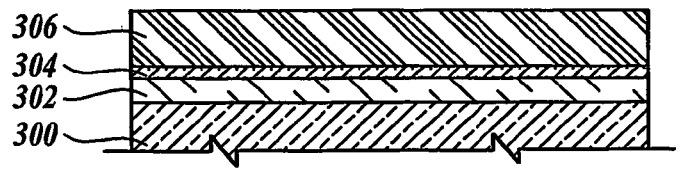
Figure 10:
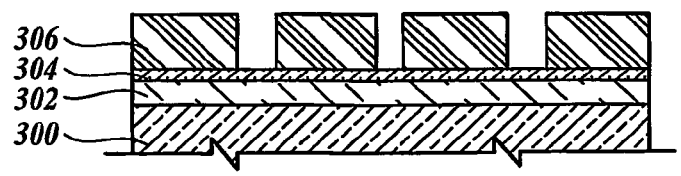

In FIG. 7, a substrate 300 is provided and a dielectric layer 302 is applied over the substrate 300. A suitable barrier layer 304 is applied to the dielectric layer 302 in a blanket process, as illustrated in FIG. 8. Referring now to FIG. 9, a photoresist 306 is deposited on the barrier layer 304. Deposition of photoresist 306 can take place according to any well-known technique. In FIG. 10, conventional photolithographic techniques are applied to the photoresist to provide the desired negative of the metallized features to be formed in subsequent steps.

Figure 11:
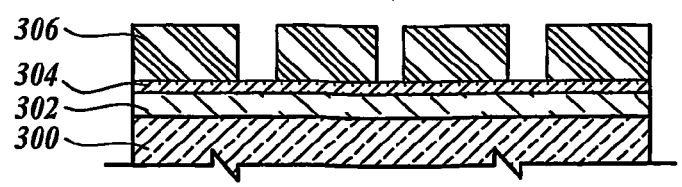

Referring to FIG. 11, in accordance with one aspect of the present invention as described below in more detail, the exposed portions of barrier layer 304 are treated in accordance with the present invention. As discussed below, such treatments include electrolytically treating or acid treating the exposed surface of barrier layers 304, or depositing a bonding layer onto the exposed portions of barrier layer 304. When the exposed portions of barrier level 304 are acid treated or electrolytically treated in accordance with the present invention, the electrolyte bath or acid solution should be chosen so as not to adversely affect the photoresist or other features on the workpiece surface.

Figure 12:
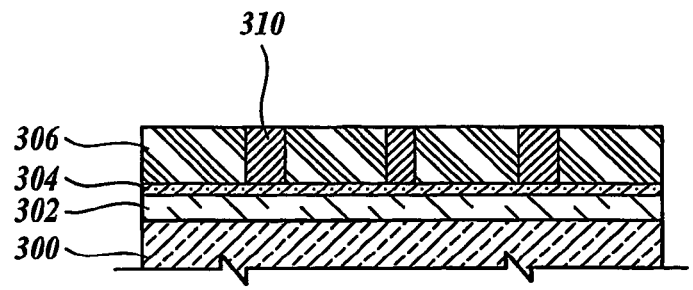

Referring now to FIG. 12, after treating the barrier layer 304 in accordance with the present invention, electrodeposition of the metallized feature 310 can take place to complete the metallized feature. While not shown in the FIGS. 7–15, in some aspects of the invention, it may be advantageous before bulk deposition occurs, to provide an electrolytically deposited metal seed layer. The metallized feature 310, whether it be a metal seed layer or bulk metal feature, advantageously adheres to the treated surface of barrier layer 304 without the need for a PVD or CVD seed layer.

Figure 13:
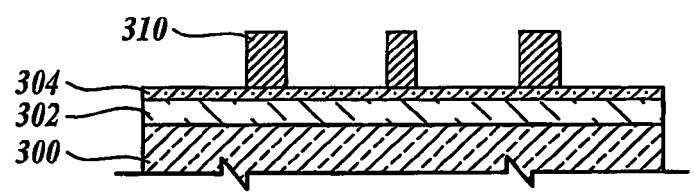
Figure 14:
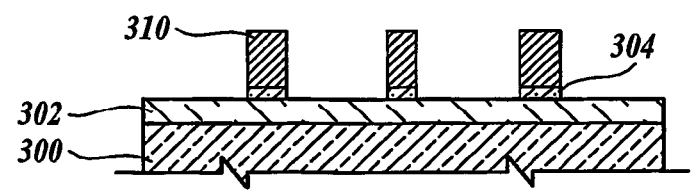
Figure 15:
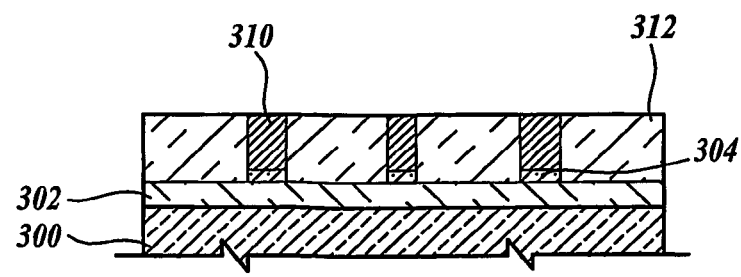

Referring now to FIG. 13, photoresist 306 present in FIG. 12 has been stripped using conventional techniques to further expose the metal structures. Referring to FIG. 14, those portions of barrier layer 304 exposed by removal of photoresist 306 are removed. In certain instances, removal of the exposed portions of barrier layer 304 may require that steps be taken to protect those portions of the exposed deposited metal structure. For example, isolating the exposed portions of metallized feature 310 from the conditions used to remove the exposed portions of barrier layer 304. In FIG. 15, a dielectric material 312 is applied to the workpiece to encapsulate the metal structures. The aforementioned sequence of processing steps may be repeated to form further levels containing any number of metallized features.

While representative examples of sequences of processing steps have been presented above, the present invention is useful in other processing schemes that include different steps for producing metallized features on a microelectronic workpiece.

Without being bound by theory, the acid or electrolytic treatment of the barrier layers in accordance with the present invention is believed to remove natural oxides that form on the surface of the barrier layer, or convert them to more desirable species. In addition, it is believed that the present invention increases the number of activation sites on the surface of the barrier layer where nucleation of the metals comprising the metallized feature can occur. The acid and electrolytic treatments are described below in more detail.

Acid Treatment

In accordance with one aspect of the present invention, barrier layer 104 is treated by contacting the exterior surface of the barrier layer 104 with an acid solution. The acid solution need not contain metal ions that are readily deposited onto the barrier layer. If the bath includes metal species that readily deposit onto the barrier layer, such deposition can be avoided by contacting the barrier layer 104 with the solution in the absence of electrical power.

The acid treatment of the barrier layer 104 can be carried out in an aqueous solution containing an acid. The selection of a specific acid and its concentration will depend in part upon the particular material of the barrier layer. Selection of an appropriate acid should take into consideration factors such as selectivity of acid for the barrier layer material, effect of acid on other features, aggressiveness of acid toward barrier layer material and compatibility of the acid with the overall workpiece processing sequence. One suitable bath is an aqueous solution having a nitric acid concentration up to about 50 weight %. An aqueous solution of nitric acid containing about 20–30 weight % nitric acid is particularly suitable for treating titanium nitride barrier layers.

Hydrofluoric acid is another suitable acid for treating barrier layers in accordance with the present invention. When hydrofluoric acid is used as a treating acid for tantalum barrier layers, aqueous solutions having hydrofluoric acid concentrations less than about 5 weight % are suitable. Such cleaning solutions may incorporate wetting agents/surfactants at parts per million concentration levels. Hydrofluoric acid concentrations below about 5 weight % are desired in order to etch the barrier layer at an acceptable rate. At concentrations of 5 weight % and above, the rate that hydrofluoric acid etches the barrier layer makes it difficult to accurately control the degree of the etching. In addition, at lower acid concentrations the effect of the loss of acid from solution due to vaporization of the acid is lower compared to the effect of vaporization from solutions having a higher acid concentration. By minimizing the degree to which the concentration of acid in the treating solution changes over time, the consistency and repeatability of the treatment from wafer to wafer is maximized. In addition, lowering the loss of acid from solution due to vaporization results in less chemical consumption and waste, which provides a cost savings and an environmental benefit. Other useful acids include hydrochloric, methane-sulfonic, and sulfuric.

The acid solution can be contacted with the barrier layer for varying amounts of time. The length of the contact will vary depending upon the material comprising the barrier layer, as well as the concentration of the acid in the solution. Shorter times are preferred in order to increase throughput. Contact times on the order of 10 to 25 seconds are exemplary, although longer times may be necessary and shorter times may provide satisfactory results.

An exemplary acid treatment for a tantalum barrier layer employs an aqueous solution containing about 2 wt % hydrofluoric acid and is carried out in a conventional spray chamber. When the workpiece includes a silicon wafer, spraying treatment solutions on the surface of the wafer is preferred, as opposed to dipping the wafer into the acidic treatment solutions, in order to avoid degradation of the silicon (present on the backside of the wafer) by the acid solution. The acid treatment generally involves steps of applying the acid to the surface of the workpiece followed by rinsing and removal of the rinsing solution.

An exemplary sequence of steps includes rinsing the surface of the wafer carrying the barrier layer with deionized water for about 15 seconds at a wafer rotation rate of about 50 rpms. The hydrofluoric acid solution can then be sprayed onto the surface of the wafer for 15 seconds with the wafer rotating at about 150 rpms. Following the acid treatment, the surface of the wafer is rinsed with deionized water for 15 seconds while rotating at about 250 rpms. Following termination of the deionized water rinse, the wafer is spun for about 5 seconds at about 250 rpms in order to remove the large water droplets from the surface of the wafer. The wafer is then wet-transferred to a plating chamber where a metallized feature can be electroplated onto the barrier layer.

Electrolytic Treatment

In this aspect of the present invention, the surface of barrier layer 104 is modified by electrolytically treating the exterior surface of the barrier layer 104 in an alkaline or acid solution.

In one instance, the barrier layer serves as a cathode and undergoes cathodic treatment with an inert anode, such as platinum, in a suitable reactor or chamber. Optionally, the barrier layer can undergo an anodic treatment to provide a barrier layer that adheres more strongly to the subsequently deposited metal compared to the adhesion between an untreated barrier layer and a deposited metal. Additionally, a combination of cathodic treatment followed by a mild anodic treatment of the barrier layer may be employed.

Metallized features that are electrochemically deposited on barrier layers that have been modified through this electrolytic treatment exhibit improved uniformity and adhesion of the metallized features to the barrier layer compared to metallized features that are deposited onto untreated barrier layers. Without intending to be bound by theory, it is believed the cathodic treatment converts native oxides on the surface of the barrier layer to other species (e.g., metal hydrides M-H), leaving a barrier layer surface that is more suitable for receiving and adhering metallized features deposited by a subsequent electrochemical process.

As noted above, an anodic treatment can follow the cathodic treatment. It is believed that the anodic treatment produces a metal oxide layer on the barrier that contributes to the adhesion between the barrier layer and the metallized feature deposited on the barrier layer. Some barrier layer materials are naturally more suited to treatment using the cathodic and anodic treatment rather than a cathodic treatment alone. One consideration which may influence the decision of whether to use anodic or cathodic cleaning or both is the rate at which the barrier layer material has a tendency to form a native oxide (M-O) and the tendency with which the native oxide is converted to metal hydride. If a barrier layer has a tendency to quickly form a metal oxide, anodic treatment followed by a cathodic treatment is suggested in order to form a species (e.g., M-H-O-) more suitable for electrochemical deposition of a metallized feature.

In cases where the adhesion between the barrier M-O and the seed layer metal is high, then anodic treatment of the barrier metal creating favorable species (M-O-) may be employed to improve adhesion, nucleation, and texture of the electrodeposited features.

After the barrier layer is placed in contact with the appropriate acid or alkaline solution, suitable power is applied to the barrier layer and to an electrode in contact with the solution. The particular current density, treatment time and bath compositions are not believed to be critical and can be chosen to achieve the results described above. As an example, current densities can range on the order of about 10 mA/cm$^2$ or higher and suitable time periods for the electrolytic treatment may range from about 15 seconds to a minute. A suitable bath for electrolytic treatment described herein may incorporate about 1–20 weight % of an electrochemically inert neutral ionic salt, about 1–10 weight % of a strong acid, about 1–10 weight % of a strong base, or a combination of the above with/without small quantities of wetting agents. A suitable electrolytic cleaning bath need not contain any metal ions that are readily deposited onto the barrier layer. The bath should be moderately conductive to ensure treatment of the entire barrier layer surface without being subjected to large terminal effects. Preferably, the electrolytic treatment bath will contain constituents that are the same or similar to the bath used to subsequently plate metal onto the barrier layer, or at least to ensure that the constituents of the electrolytic treatment bath do not interfere with the subsequent deposition of the metallized feature onto the treated barrier layer.

In an alternative embodiment to this aspect of the present invention, the alkaline or acidic solution described above can be an alkaline or acidic plating bath that includes components useful to electrolytically deposit a metallized feature. In this embodiment, the cathodic treatment can be performed just below the deposition potential of the electroplating bath solution. Voltage control can be implemented to prevent the deposition of the metal ions until a sufficient period of time has elapsed to modify the surface of the barrier layer as described above. The anodic treatment can likewise be carried out in a potential range just below the oxygen evolution potential or just below the dissolution potential of the metal. In this way, the evolution of mascent oxygen or the dissolution of the metal may provide a clean, fresh surface/new species for electroplating another metal onto it. Carrying out the cathodic and/or anodic treatment using an electroplating bath has the inherent advantage that it is in situ and the wet transfer of the workpiece and drag out from the electrolytic treatment bath to the plating bath are avoided. Additionally, by carrying out the treatment of the surface of the barrier layer in the same reactor where the metallized feature is to be deposited onto the barrier layer, exposure to oxygen and the resultant formation of the undesirable native oxides can be more readily controlled.

Electroplating Solutions

Choice of an appropriate electroplating bath composition must take into consideration the electrical resistivity of the barrier metal. Failing to take into consideration the electrical resistivity of the barrier layer can result in non-uniform deposits of the metallized feature near the center of the wafer due to the non-uniform distribution of electroplating power across the wafer. The electroplating bath composition and the design of the chamber in which the electroplating of the metallized feature occurs should be chosen so that the potential drop across the wafer is as small as possible relative to the potential drop resulting from the electroplating bath composition and the chamber design. More uniform electroplating of metals onto the barrier layer can be achieved when the activation over potential required in surmounting the potential barrier for reaction and the concentration over potential can be increased. Other factors which can be modified to improve the uniformity of the deposited metallized feature across the surface of the wafer include use of multiple anodes to apply different currents on different zones of the wafer. Uniformity of the deposited metallized feature may also be improved by providing a current thief at the edge of the wafer to compensate for any terminal effect that might affect the uniformity of the deposited metal.

Suitable plating bath solutions to deposit a copper seed layer or bulk metallization layer include the following:
1. Copper sulfate: 0.004 M to 1.0 M;
2. Complexing agent: complex to metal ratios from 1 to 4;
3. Boric acid: 0.001 M to 0.5 M; and
4. tetramethylammonium hydroxide.

An exemplary bath contains 10 g/l copper sulfate, 5.5 ml/l ethylene diamine, 3.1 g/l boric acid, and tetramethylammonium hydroxide. It should be understood that the foregoing is an example of a suitable bath, but that concentration values can change depending upon the particular application involved. Through the control of known operational parameters and chemistry, seed layers ranging in thickness from 60–100 nanometers or thicker can typically be deposited onto the barrier layer.

The above representative bath solution, however, is not intended to limit the scope of the present invention. Baths solutions deriving copper from sources other than copper sulfate are within the scope of the present invention. Such sources include copper gluconate, sodium copper cyanide, copper sulfamate, copper chloride, copper citrate, copper fluoroborate and copper pyrophosphate or any combination thereof. Likewise, where an acid is utilized to yield an acidic bath solution, acids such as methyl sulfonic acid, fluoroboric acid, pyrophosphate and citric acid may be used in accordance with the present invention.

Useful complexing agents form a stable complex with copper ions and prevent the precipitation of copper hydroxide. Ethylene diamine tetraacetic acid (EDTA), ethylene diamine (ED), citric acid, and their salts have been found to be particularly suitable copper complexing agents. Such complexing agents can be used alone, in combination with one another, or in combination with one or more further complexing agents.

An alkaline electrolytic bath solution is maintained at a pH of at least about 9.0. Potassium hydroxide, ammonium hydroxide, tetramethylammonium hydroxide, or sodium hydroxide can be utilized to adjust and maintain the pH at the desired level of 9.0 or above. A suitable pH for a citric acid or ED bath solution is about 9.5, while a suitable pH for an EDTA bath solution is about 12.5.

Additional components can be added to the alkaline copper bath solution such as brighteners. For example, boric acid ($H_3BO_3$) aids in maintaining the desired pH when citric acid or ED is used as the complexing agent, and provides brighter copper deposits.

In general, the temperature and pH of the bath can be chosen taking into consideration conventional factors such as complexing ability of the complexing agent, buffering capability of the buffers, metal concentrations, volatile organics concentration, deposition potential of the complex at the particular pH, solubility of the bath constituents, stability of the bath, characteristics of the deposits, and diffusion coefficients of the metal species. Generally, temperatures ranging from about 20–35° C. are suitable, although temperatures above or below this range are contemplated for an alkaline electrolytic bath. A pH of at least about 9.0 is desirable, although pHs above or below 9.0 are contemplated. The current density and waveform should be chosen taking into consideration factors such as pH, free metal concentration, complexed species concentrations, total metal concentrations, diffusion coefficients of depositing species, limiting current densities, deposition potentials, various over potentials, conformality of the deposit, rotation rate, and electrolyte flow rate. While not intending to be limited to any particular current density, acceptable electroplating of copper onto a barrier layer can be achieved with current densities ranging from about 0.5 to about 30 mA/cm$^2$.

Although the foregoing alkaline bath solution compositions may be used for the electrolytic deposition following treatment of the barrier layer in any one of the different aspects of the invention, the present invention is not limited to depositing metallized features using alkaline bath solutions. In some instances, acidic bath solutions may be desired, particularly in view of their substantially higher plating rates. When choosing and formulating an acidic plating bath, the components and process parameters should be selected so that a uniform deposition of the metallized feature occurs across the surface of the wafer.

As an alternative to deposition of a feature comprising a single metal as discussed above, an alloy can be deposited as a metallized feature. The composition of the alloy forming the metallized feature can be constant throughout or the composition of the alloy can vary from one surface of the feature to the opposing surface.

An example of an alloy of constant composition is given by the formula $A_xB_y$, where A represents a first metal species, and B represents a second metal species, and wherein X and Y represent the atomic percentage of the metal species A and the metal species B, respectively. Atomic percent (%) means the number of atoms of the element under discussion for every 100 atoms of the alloy composition. X and Y can be any value greater than 0 to less than 100%, so that the sum of X and Y equal 100%. When the alloy is deposited as a seed layer, metal B can be a metal species that is also suitable to form a metallized feature on the alloy seed layer, such as copper. Without limitation, metal A can be chromium, nickel, zinc, cobalt, aluminum, boron, magnesium, and cerium or any other metal that is compatible with metal B and which provides an alloy that adheres to the metal used to form a metallized feature on the seed layer. The amounts of metal species A and metal species B can be chosen so as to provide optimum adhesion between the acid treated, electrolytically treated, or untreated barrier layer and the alloy seed layer. The amounts of metals A and B should also be chosen so that adequate deposition rates can be achieved as well as adequate coverage of the barrier layer.

The thickness of the alloy seed layer can be varied, taking into consideration a number of factors. For example, the alloy seed layer should be thick enough to provide adequate coverage of barrier layer. In order to reduce processing time and material cost, alloy feature seed layer should be as thin as possible.

As noted above, the composition of the alloy seed layer can vary from the barrier layer interface to the interface at a metallized feature formed on the seed layer. In this embodiment, the composition of the alloy layer is high in the alloying metal species A near the barrier layer interface and high in the alloyed metal species B near the electroplated metallized feature formed on the seed layer 108. For example, metal species A in the alloy can be substantially 100 atomic % at the interface between the barrier layer and the alloy seed layer and substantially 0 atomic % at the interface between alloy feature and metallized feature deposited thereon. Conversely, the composition of metal species B can be substantially 0 atomic % at the barrier layer/alloy interface and substantially 100 atomic % at the alloy/metallized feature interface. The variation in the composition of the alloy seed layer 108 can be altered, taking into consideration a number of factors such as the materials comprising the barrier layer and metallized feature deposited on the alloy seed layer. For example, metal species A might be chosen to be the same as the metal used to form the barrier layer and metal species B might be chosen to be the same as the metallized feature to be formed over the alloy seed layer.

The thickness of an alloy seed layer having varying composition as described above can vary. An appropriate thickness can be chosen, taking into consideration factors such as those described above with respect to an alloy seed layer of constant composition.

A bath composition suitable for depositing a copper-chromium alloy as the alloy seed layer may include the following constituents:

| Constituent | Concentration |
| --- | --- |
| Cr $SO_4$ | 10–40 g/l |
| Cu $SO_4$ | 5–20 g/l |
| $(NH_4)_2 SO_4$ | 20–40 g/l |
| $NH_4$ OH | 50–100 ml/l |
| ED or EDTA | 0.1–1.0 ml/l |

The bath may be formulated from a combination of available bath solutions with other adjuvants as desired.

In some instances, the bath solution may include additional agents such as brighteners, levelers, accelerators, and suppressors to facilitate formation of the alloyed seed layer.

While an electrolytically deposited alloyed seed layer feature is an embodiment of the present invention, the feature can alternately be deposited in accordance with the present invention using other deposition techniques such as electroless plating. Furthermore, the present invention is not limited to alkaline baths for depositing alloyed features, acidic baths, capable of depositing alloy seed layers are also within the scope of the present invention.

The electroplating system can be adjusted and/or programmed for the appropriate processing parameters to control the composition of the deposited alloy seed layer. Electroplating bath solution flow rate, pH, temperature, concentration of metals to be deposited, concentration of complexing agents for the metal species A, and/or the second metal species B, current density, deposition potential and wave form of electroplating power applied, and rotation rate of workpiece can all affect the quality and composition of the deposited alloy seed layer. The adjustment and/or programming of these variables can take place either manually or using a programmable control system taking into consideration known criteria Without limitation, exemplary acidic bath processing parameters include a flow rate up to 5 gallons per minute for a plating bath solution having a temperature up to about 65° C., a pH up to about 4, and a concentration of metal ion species A and B in the range of about 2–16 grams per liter. Electroplating power having a current density in the range of about 20–50 $mA/cm^2$ is suitable. A pulse waveform having an on time of about 1–10 milliseconds, and an off time of about 1–10 milliseconds is suitable. Deposition rates in excess of 550 åangströms per minute are typical using the above noted acidic plating parameters.

Reference is made to U.S. Pat. No. 6,319,387 for its disclosure regarding the composition of useful copper alloys, baths for depositing such alloys, and processes for depositing such alloys. The disclosure of U.S. Pat. No. 6,319,387 is expressly incorporated herein by reference.

Following the deposition of an alloy seed layer, a second electroplating process can deposit gap fill metal or other features onto the alloy seed layer.

In accordance with a third aspect of the present invention, it is contemplated that the alloy composition of constant or varying composition described above for a seed layer can also serve to supplement a barrier layer and serve as a bonding layer between a barrier layer that has not been acid treated or electrolytically treated as described above and a subsequently deposited metal feature. In this regard, it is not necessary to treat the barrier layer with acid or electrolytically, but rather directly deposit the described alloy onto a barrier layer that has not been acid or electrolytically treated in accordance with the present invention, followed by depositing gap fill or bulk metallization onto the deposited alloy. In addition to the alloys described above, a bonding layer comprising a single metal may also serve to supplement and improve the adhesion between a barrier layer and subsequently deposited gap fill metallization. Examples of such metals that may be useful as a bonding layer include chromium, nickel, zinc, cobalt, aluminum, boron, magnesium, and cerium, or any other metal that adheres to the barrier layer material, as well as the material used for gap filling.

The present invention may be suitably carried out in commercially available apparatus, which are arranged and have controllers that are then modified to be programmed in accordance with the present invention. An integrated processing tool that incorporates one or more chambers that are particularly suitable for implementing the foregoing electrochemical deposition, acid or electrolytic treatment and surface preparation processes is the LT210™ ECD system available from Kalispell, Mont., and as further described in International PCT Application No. WO 98/02911 (PCT/US97/12332), the disclosure of which is hereby expressly incorporated by reference. Other commercially available ECD systems such as the Equinox™ model tool, available from Semitool, Inc., are also suitable for use in practicing the present invention. Such tools are readily adapted to implement a wide range of processes used in the fabrication of microelectronic circuits and components of the present invention. In addition to electroplating reactors, such tools frequently include other ancillary processing chambers, such as pre-wetting chambers, rinsing chambers, etc., that are used to perform other processes typically associated with electrochemical deposition. Semiconductor wafers, as well as other microelectronic workpieces, are processed in such tools in the reactors and are transferred between the processing stations, as well as between the processing stations and input/output stations, by a robotic transfer mechanism. The robotic transfer mechanism, the electroplating reactors, and the plating recipes used therein, as well as the components for the processing chambers are all under the control of one or more programmable processing units.

EXAMPLE 1

Acid Treatment of Barrier Layer.

Acid treatment of a tantalum barrier was performed using 2% by weight aqueous solution of hydrofluoric acid. A 200 mm blanket wafer deposited with 25 nanometers of PVD tantalum barrier was used. This rotating wafer was subjected to a water spray treatment for 15 seconds followed by an acid spray treatment for 15 seconds. Then the rotating wafer was cleaned by spraying de-ionized water for another 15 seconds to remove the excess acid from its surface. For an additional 5 seconds, the wafer was rotated to sling off large water droplets. The wafer was then wet-transferred to a plating chamber. In the plating chamber, the wafer was plated with copper up to a thickness of ~80 nanometers. After plating, the wafer was cleaned insitu with de-ionized water and the wafer was transferred to a SRD (Spin, Rinse, and Dry) chamber. In this SRD chamber, the spinning wafer was once again cleaned with de-ionized water thoroughly to remove any plating chemistry left on its surface. After rinsing, the wafer was dried by spinning it in the chamber for several seconds at various rates. After drying, the wafer can be transferred to an anneal/thermal station where it may be further processed. At this stage before the thermal processing, the wafer needs to be intact, with no adhesion losses. FIG. 19 shows a close-up of the edge of the processed wafer before thermal treatment. No adhesion loss is evident. FIG. 17 shows a wafer processed as described above without an acid pre-treatment. Poor adhesion is evidenced at the edge of the wafer of FIG. 17.

EXAMPLE 2

Electrolytic Treatment of Barrier Layer.

Electrolytic treatment of a tantalum barrier was performed using 2% by weight of potassium hydroxide aqueous solution. A 200 mm blanket wafer with 25 nanometers of PVD tantalum barrier was treated. This rotating wafer was used as a cathode and subjected to a current of 1 A (~3 mA/cm$^2$) for one minute while an inert platinum electrode was the anode. The wafer was then wet-transferred to a SRD chamber where the spinning wafer was rinsed with de-ionized water and then once again wet transferred to a plating chamber. In the plating chamber, the wafer was plated with copper up to a thickness of about 80 nanometers. After plating, the wafer was cleaned insitu with de-ionized water and the wafer was transferred to a SRD chamber. In this SRD chamber, the spinning wafer was once again cleaned with de-ionized water thoroughly to remove any plating chemistry left on its surface. After rinsing, the wafer was dried by spinning it in the chamber for several seconds at various rates. After drying, the wafer can be transferred to an anneal/thermal station where it could be further processed. At this stage before the thermal processing, the wafer needs to be intact, with no adhesion losses. FIG. 21 shows a close-up of the edge of the wafer before thermal treatment. The wafer in FIG. 21 evidences no adhesion loss compared to the water in FIG. 12 (adhesion loss at the edge) processed similarly without the electrolytic pre-treatment.

While the preferred embodiment of the invention has been illustrated and described, it will be appreciated that various changes can be made therein without departing from the spirit and scope of the invention.

The invention claimed is:

1. A method for forming a metallized feature on a surface of a microelectronic workpiece, comprising steps of:
    forming a barrier layer on the workpiece;
    contacting a surface of the barrier layer with an electrolyte solution;
    applying electrical power to the barrier layer and an electrode in contact with the electrolyte solution to produce an electrolytically treated surface of the barrier layer without depositing metal onto the barrier layer; and
    electrochemically forming a metallized feature on the electrolytically-treated surface of the barrier layer.

2. The method of claim 1, wherein the step of electrochemically forming a metallized feature on the electrolytically treated surface of the barrier layer comprises:
    electrochemically forming a seed layer on the electrolytically treated surface of the barrier layer.

3. The method of claim 1, wherein the step of electrochemically forming a metallized feature on the electrolytically treated surface of the barrier layer comprises electrochemically depositing copper.

4. The method of claim 1, wherein the step of electrochemically forming a metallized feature on the electrolytically treated surface of the barrier layer comprises electrochemically depositing a copper alloy.

5. The method of claim 4, wherein the copper alloy includes copper as a first metal and a second metal selected from the group consisting of chromium, nickel, cobalt, zinc, aluminum, boron, magnesium, and cerium.

6. The method of claim 1, wherein the step of forming a barrier layer on the workpiece comprises depositing titanium nitride, tantalum nitride, titanium, tantalum, or any combination thereof onto the workpiece.

7. The method of claim 1, further comprising the step of rinsing the surface of the microelectronic workpiece carrying the electrolytically treated barrier layer before electrochemically forming the metallized feature thereon.

8. The method of claim 7, further comprising rinsing and thermally treating the surface of the microelectronic workpiece carrying the electrolytically treated barrier layer and the electrochemically formed metallized feature.

9. The method of claim 1, wherein the step of electrochemically forming a metallized feature on the electrolytically treated surface of the barrier layer comprises contacting the electrolytically treated surface of the barrier layer with an electrolyte solution containing metal species to be deposited onto the electrolytically treated barrier layer.

10. The method of claim 1, wherein the step of electrochemically forming a metallized feature comprises:
    contacting the electrolytically-treated surface of the barrier layer with an electroplating solution including a source of metal ions as a principal metal species to be deposited during electroplating and providing electroplating power to electroplate the principal metal species onto the electrolytically-treated surface.

11. The method of claim 10, wherein the electroplating solution comprises a metal ion complexing agent.

12. The method of claim 11, wherein the principal metal species comprises copper, and the metal ion complexing agent is selected from the group consisting of ethylene diamine, ethylene diamine tetraacetic acid, and a polycarboxylic acid.

13. The method of claim 12, wherein the complexing agent is ethylene diamine.

14. The method of claim 12, wherein the complexing agent is citric acid.

15. The method of claim 12, wherein the complexing agent is ethylene diamine tetraacetic acid.

16. The method of claim 10, wherein the principal metal species comprises copper, and the electroplating solution further comprises boric acid.

17. The method of claim 10, wherein the source of metal ions is selected from the group consisting of copper sulfate, copper gluconate, sodium copper cyanide, copper sulfamate, copper chloride, copper citrate, copper fluoroborate, copper pyrophosphate, and combinations thereof.

18. The method of claim 10, wherein the principal metal species comprises copper, and the electroplating solution further comprises boric acid and a complexing agent selected from the group consisting of ethylene diamine, ethylene diamine tetraacetic acid, and a polycarboxylic acid.

19. The method of claim 10, wherein the electroplating power has a current density in the range of about 20–50 mA/cm2.

20. The method of claim 10, wherein the electroplating power has a pulse waveform.

21. The method of claim 10, wherein the electroplating power has a current density in the range of about 20–50 mA/cm2 and a pulse waveform.

22. The method of claim 1, wherein the step of electrochemically forming a metallized feature on the electrolytically treated surface of the barrier layer comprises electrochemically depositing ruthenium.

* * * * *